United States Patent [19]

Rubin

[11] 4,240,037
[45] Dec. 16, 1980

[54] HOMOMORPHIC AUTOMATIC GAIN CONTROL

[75] Inventor: Lawrence M. Rubin, Los Angeles, Calif.

[73] Assignee: Hughes Aircraft Company, Culver City, Calif.

[21] Appl. No.: 46,072

[22] Filed: Jun. 6, 1979

[51] Int. Cl.³ .............................................. G05B 5/00
[52] U.S. Cl. ...................................... 330/127; 328/175
[58] Field of Search ................. 330/127, 281; 328/175

[56] References Cited

U.S. PATENT DOCUMENTS 3,790,896  2/1974  Shimizu et al. ...................... 328/175

FOREIGN PATENT DOCUMENTS 290583  4/1971  U.S.S.R. .................................. 330/127

OTHER PUBLICATIONS

*Proposal for Common Module Improvement Program*, Hughes Aircraft Co., Culver City, Ca., Jun. 1977, pp. 2-17, and 2-20.

*Primary Examiner*—Alfred E. Smith
*Assistant Examiner*—T. N. Grigsby
*Attorney, Agent, or Firm*—Lawrence V. Link, Jr.; W. H. MacAllister

[57] ABSTRACT

An automatic gain control system has a multiplying circuit for multiplying levels of input and feedback signals. Such control system is provided with a closed loop homomorphic network connected between the output terminal of the control system and the feedback terminal of the multiplying circuit. Such homomorphic network maintains a compressed output signal level at the system's output terminal, inhibits oscillation and latching up of the main system in which this AGC system is a component, and provides low distortion and noise levels of signals processed by this AGC system.

7 Claims, 4 Drawing Figures

HOMOMORPHIC AUTOMATIC GAIN CONTROL

The Government of the United States of America has rights in this invention pursuant to Contract No. DAAK70-77-C-0204 awarded by United States Army.

TECHNICAL FIELD

This invention is in the field of automatic gain control (AGC) systems and more particularly in the area of such systems utilizing homomorphic principles.

BACKGROUND OF THE INVENTION

A homomorphic automatic gain control system not only compensates for different levels of input signals to the system but also enables an input signal having different frequency components of varying amplitudes to be accorded proper emphasis.

A disadvantage of prior AGC systems is that such systems tend to oscillate, latch up or lose control of the input signal when amplifiers used in the system have high gain factors and generally do not provide stable response to an input signal over a wide dynamic range.

Another disadvantage of prior art homomorphic systems is that they use an open loop control rather than a closed loop feedback path, which results in substantial error voltages that results in large distortion of the output signal.

Still another disadvantage of prior art homomorphic AGC systems is the increased noise level present in the output signal, thereby resulting in reduced amplifier gain.

A further disadvantage of prior art AGC systems is their inability to control levels of signal compression, speed of signal response and frequency response over wide frequency ranges without resorting to complex circuitry.

SUMMARY OF THE INVENTION

Accordingly an objective of this invention is to provide a homomorphic AGC system which has the capability of compensating for different levels of input signals as well as providing proper emphasis to signals of varying amplitudes and different frequencies.

Another objective of this invention is the ability of this AGC network to inhibit oscillations, latching of the system and maintaining a stable response to an input signal over a wide dynamic range.

Still another objective of this invention is the use of a closed loop control feedback network to minimize output error voltages and reduce output signal distortion.

Yet another objective of this invention is to provide circuits which reduce the noise level in the signal output generated by the AGC network.

Still another objective of this invention is to provide an AGC system with the capability of controlling the levels of signal compression, and to control the signal and frequency response over wide frequency ranges utilizing relatively simple circuitry.

In meeting the objectives of this invention a homomorphic AGC system is provided having a three terminal amplitude multiplying network joined with a homomorphic feedback loop.

The multiplying network multiplies the levels of input and feedback signals, and the homomorphic closed feedback loop provides a variety of control functions and a feedback signal to an input of the multiplier so as to maintain a compressed output signal level at the output of the AGC network.

The AGC network compensates for different signal level inputs and provides emphasis upon signals of varying amplitudes and frequencies. Such system inhibits oscillation and latching up of the main system to which this AGC system is connected, and maintains stable input signal amplification even when high gain factors are involved.

The closed loop homomorphic feedback component group minimizes signal output error voltages and reduces distortion and noise level in the processed signal. This AGC system, by virtue of its homomorphic feedback loop, controls signal compression rates and enables the system of which it is a part of to have high speed and stable response characteristics over wide frequency ranges.

DETAILED DESCRIPTION OF THE INVENTION

Figure 1:
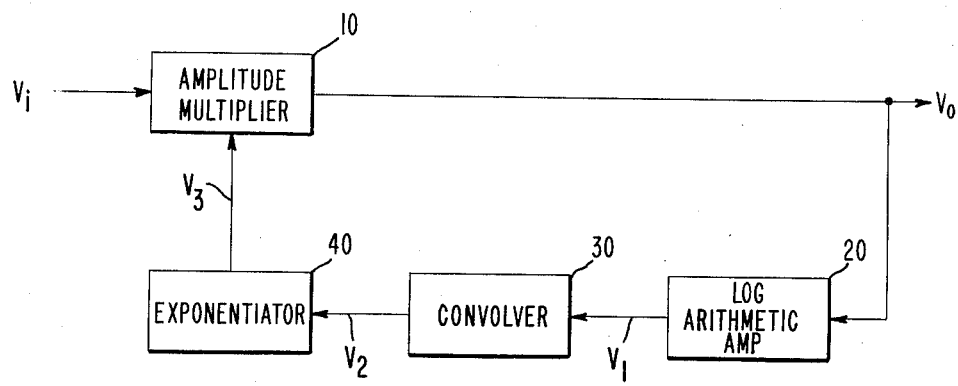
FIG. 1 is a block diagram schematic of the AGC system in accordance with the invention.

Referring to the FIGURES a homomorphic automatic gain control system, schematically depicted in FIG. 1, enables an input signal having frequency components of varying amplitudes to be given proper emphasis. Such system enables signal amplitude inputs to provide feedback signals by means of a feedback loop of the system consisting of several components each of which has a different type of transfer function response, some components having non-linear transfer functions and another having a linear response.

The following description of the system is in terms of input and output voltages, but it is to be understood that such system may be expressed in terms of input and output currents, if desired.

An input voltage $V_i$ feeds amplitude multiplier 10 at one of its input terminals. Such amplitude multiplier will multiply input $V_i$ with output $V_3$ from exponentiator 40, and accordingly the outpt $V_o$ of multiplier 10 will be connected to the overall system in which this AGC subsystem is a part of. The output $V_o$ may be expressed mathematically as follows:

$$V_o = (V_i)(V_3) \tag{1}$$

The output at $V_o$ provides an input to non-linear log arithmetic amplifier 20 which converts the $V_o$ signal and provides an output $V_1$ from such non-linear amplifier 20 which is a function of the natural logarithm of the absolute value of $V_o$ as expressed by the following relationship:

$$V_1 = K_1 \ln |V_o| \tag{2}$$

wherein $K_1$ is a constant of proportionality of the output signal from circuit 20.

The output signal $V_1$ is fed as an input to convolver 30, which convolver can be embodied as a linear filter of input signal $V_1$ to provide an output signal $V_2$ therefrom as stated by the following expression:

$$V_2 = K_2 V_1 \oplus h \qquad (3)$$

wherein $K_2$ is a proportionality constant for convolver 30 and convolution symbol $\oplus$ denotes the convolution of h with $V_1$, wherein h is the impulse response of the convolver 30.

The output of convolver 30, provides an input to exponentiator 40. Exponentiator 40 operates to provide an output $V_3$ therefrom which is an exponential function of $V_2$. Such signal conversion from $V_2$ to $V_3$ is stated by the following expression:

$$V_3 = K_3 e^{V_2} \qquad (4)$$

wherein $K_3$ is a constant of proportionality for exponentiator 40.

For proper operation of the feedback loop consisting of circuits 20, 30 and 40, the product of $K_1$ and $K_2$ should be less than zero or a negative value.

Accordingly, the output of exponentiator 40, defined as $V_3$ in equation (4) provides an exponential function into another input terminal of multiplier 10. Multiplier 10 performs a multiplication operation of $V_3$ and $V_i$, as expressed by equation (1), and therefore $V_o$ output of the inventive system represents the product amplitude of $V_i$ and $V_3$.

According to the invention, the feedback loop consisting of circuits 20, 30 and 40, jointly provide a number of advantages over prior AGC systems. This group of circuits herein referred to as the homomorphic group, enables the compensation for different levels of input signals as well as provides proper signal emphasis for signals of varying amplitudes and different frequencies. This homomorphic group also inhibits oscillations, prevents the effects of positive feedback such as latching, and maintains a stable response to an input signal over a wide dynamic signal range.

Due to the closed loop control feedback path, this homomorphic group of circuits jointly minimizes output error voltages and reduces output signal distortion. At the same time such homomorphic circuit group also reduces the noise level in the signal output from the AGC network at terminal $V_o$.

As a consequence, the resultant AGC system is provided with the capability of controlling the degree of signal compression and also has the capability of controlling signal and frequency response over wide frequency ranges by utilizing relatively simple circuitry.

The reason that this type of AGC provides superior performance to prior art automatic gain control systems rests on the fact that a multiplicative gain factor applied to an input signal will be separated into two additive components by logarithm amplifier unit 20. These additive components can then be preferentially filtered by the convolutional element unit 30 providing a separation of a slower changing low frequency gain component from a higher frequency non-gain dependent signal component. Following the separation of the gain components by unit 30, a compensation signal is developed in unit 40 which is inversely proportional to the output signal gain component, derived from unit 30. In this fashion the homomorphic feedback loop will provide an appropriate correction signal to be provided to amplitude multiplier 10. Furthermore, variations in the amplitude multiplier gain will not effect the response of this loop to variations in input signal amplitude. This is also due to the additive component separation capability of the logarithmic amplifier. By providing a closed loop rather than open loop homomorphic control, the high frequency signal bearing components of $V_i$ are not required to pass through the non-linear components such as units 20 and 40. In this fashion, degradation due to errors in the makeup of units 20 and 40 will not critically effect the information bearing signal components in the input signal, but rather change slightly the amount of gain provided to these input signals by the homomorphic feedback loop. This will provide for less distortion of the resultant output signal $V_o$ of important information-bearing components contained therein. Finally, by employing such homomorphic feedback loop, the amount of noise output present is vastly reduced due to the signal averaging properties of convolver 30. In prior art automatic gain controls, which have operated in an open loop fashion, the full bandwidth of the input signal must be provided prior to the exponentiation operation. This prior art AGC system will generate a significant amount of noise in the output signal.

Each of the components of the system illustrated in FIG. 1 may be found individually in publications. Amplitude multiplier 10 is illustrated and explained at page 4-29 containing an accompanying FIG. 7 in the textbook entitled General Catalog, 1979 issue, published by Burr-Brown of Tucson, Ariz. In FIG. 7 of the Burr-Brown publications, the terminal marked $X_{in}$ is equivalent to the $V_3$ input to multiplier 10. The terminal marked $Y_{in}$ is equivalent to the $V_i$ input to the inventive system, and the terminal marked with numeral 4 is equivalent to the $V_o$ output terminal. Insofar as the logarithm amplifier 20 is concerned, such circuit is comprised of two circuits found in the publication entitled Master OP-AMP Application Handbook by Fox, published by Tab Books, Blueridge Summit, Pa., First Edition, 1978.

The first of such circuits comprises FIGS. 8-9 at page 322 with discussion thereof at page 322. Such circuit shows an input and an output terminal. The second of such circuits is shown in FIGS. 8-18 at page 336, with discussion at pages 331-335. The output terminal from FIGS. 8-9 is fed to the input terminal for FIGS. 8-18. Consequently, the input terminal of FIGS. 8-9 is equivalent to the $V_o$ signal input to logrithm amplifier circuit 20, and the output from FIGS. 8-18 is equivalent to output $V_1$ from amplifier 20. A typical circuit for convolver 30 may be found at page 23, FIG. 1.29 (b) of the publication entitled Handbook of Filter Synthesis by Zverev, published by John Wiley and Sons, New York, copyright 1967. The inputs and outputs of the circuits in this publication are identical to the inputs and outputs to convolver 30. The exponentiator circuit 40 may be found in the publication entitled Master OP-AMP by Fox, published by Tab Books, Blueridge Summit, Pa., First Edition, 1978, at pages 335-338 with the schematic thereof shown at page 337 as FIGS. 8-19. Input $V_i$ in such publication is analogous to $V_2$ of exponentiator 40, and output of such circuit $V_o$ is analogous to $V_3$ output from exponentiator 40.

Figure 2:
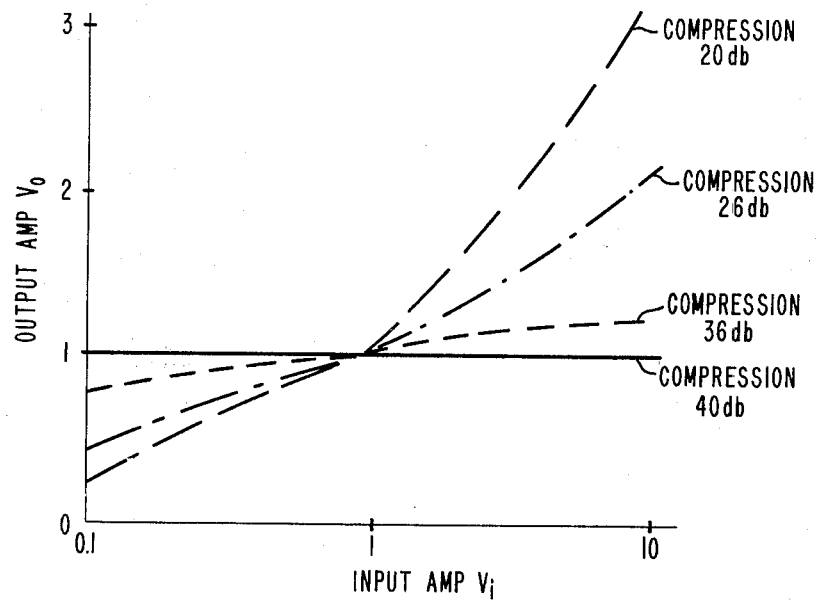
FIG. 2 consists of a family of signal compression curves relating input and output signals of the system.

FIG. 2 shows in exemplary manner the varying degrees of signal compression that the inventive AGC circuit can provide. These different levels of compression can be controlled by varying the constants $K_1$ and $K_2$, as stated in equations (2) and (3), of components 20 and 30 of the homomorphic component group. By varying such parameters, the different levels of signal compression can be obtained for different values of input and output signal amplitudes.

Figure 3:
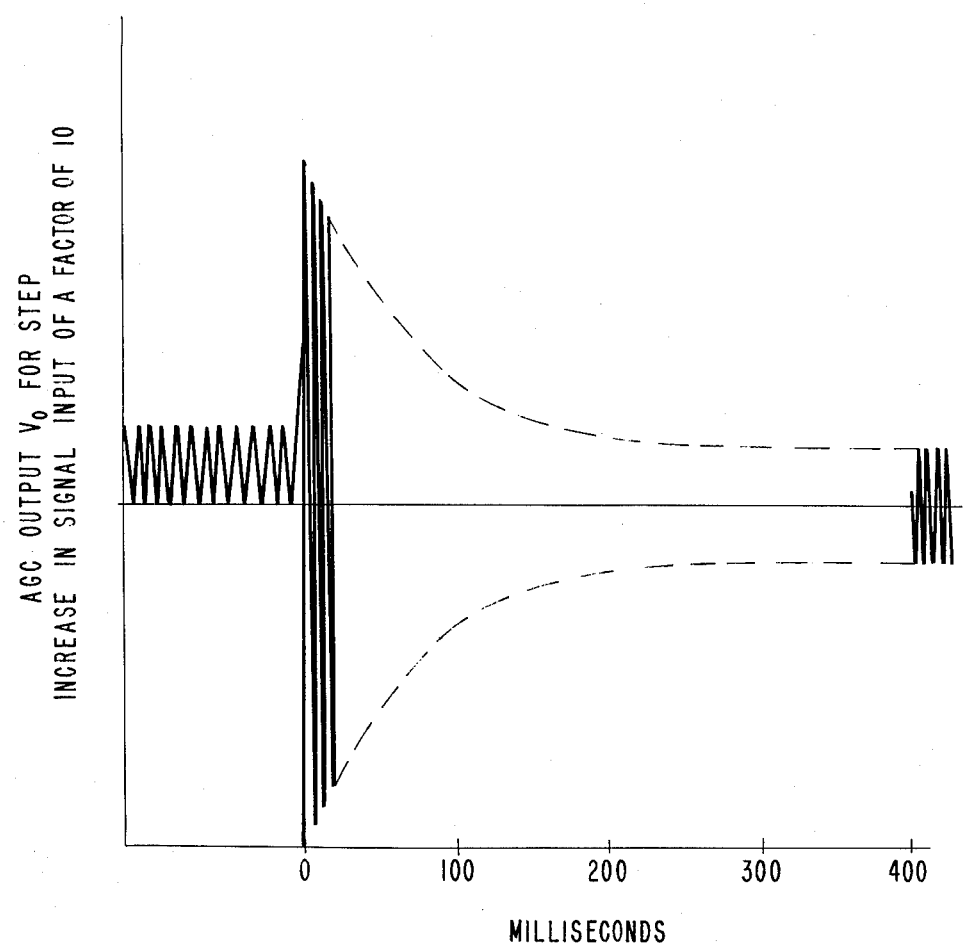
FIG. 3 shows the output response characteristics of the system for a step increase in signal input of a factor of ten.

Referring to FIG. 3, the response of the inventive AGC system to a step change in input signal level exhibits certain performance characteristics of the system. Initially, before the feedback loop has time to react to a signal change, the output signal level $V_o$ will jump dramatically in amplitude, and as the loop reacts to this change in output signal amplitude, its amplitude will be attenuated by operation of the exponentiator feeding the multiplier circuit, and resulting in an attenuated output signal $V_o$ as a function of time.

Figure 4:
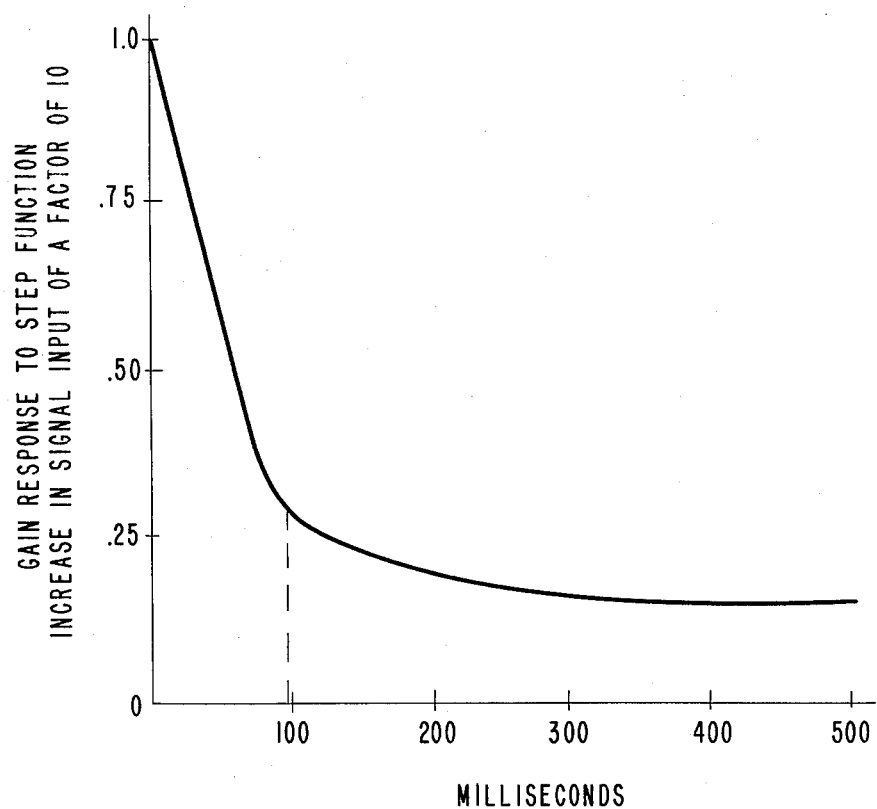
FIG. 4 is the gain response of the system to a step function increase in signal input of a factor of ten.

Referring to FIG. 4, the response characteristic or gain response of the homomorphic loop to a step function signal input increase of a factor of ten, is typical of gain characteristics of this system to step function inputs.

Initially the signal amplitude is at its normal value, and as the homomorphic loop acts to correct the signal output for the variation in signal input amplitude, it can be seen from FIG. 4 that the gain response of the system changes, compressing the gain down to 25 percent of its normal level.

I claim:

1. An automatic gain control system, comprising the combination of:
   a multiplying means, having input, output and feedback terminals, for multiplying the levels of input and feedback signals; and
   homomorphic means, connected between the output and feedback terminals, for providing a feedback signal from the output terminal to said feedback terminals so as to compress the input signal to a predetermined level.

2. The invention as stated in claim 1, wherein said homomorphic means includes first means, coupled to said output terminal, for producing a signal proportional to the logarithm of the absolute value of said output signal.

3. The invention as stated in claim 2 where said homomorphic means further includes second means, fed by said first means, for providing an output therefrom which is proportional to the convolution of its signal response and the signal provided by the first means.

4. The invention as stated in claim 3, wherein said homomorphic means still further includes third means, fed by said second means, for providing a signal therefrom proportional to an exponential function of the signal provided by the second means, said third means feeding said multiplying means.

5. The invention as stated in claim 1, wherein said homomorphic means comprises:
   first means, coupled to said output terminal, for producing a signal proportional to the logarithm of the absolute value of said output signal;
   second means, fed by said first means, for providing an output therefrom which is proportional to the convolution of its signal response and the signal provided by the first means; and
   third means, fed by said second means, for providing a signal therefrom proportional to an exponential function of the signal provided by the second means.

6. The invention as stated in claim 5, wherein said predetermined level is a function of the gain of the first means.

7. The invention as stated in claim 5, wherein said predetermined level is determined by the transfer function of the second means.

* * * * *